(12) United States Patent
Nomura et al.

(10) Patent No.: US 11,961,708 B2
(45) Date of Patent: Apr. 16, 2024

(54) CHARGED PARTICLE BEAM WRITING APPARATUS, CHARGED PARTICLE BEAM WRITING METHOD, AND A NON-TRANSITORY COMPUTER-READABLE STORAGE MEDIUM

(71) Applicant: NuFlare Technology, Inc., Yokohama (JP)

(72) Inventors: Haruyuki Nomura, Yokohama (JP); Noriaki Nakayamada, Yokohama (JP)

(73) Assignee: NuFlare Technology, Inc., Yokohama (JP)

( * ) Notice: Subject to any disclaimer, the term of this patent is extended or adjusted under 35 U.S.C. 154(b) by 547 days.

(21) Appl. No.: 17/236,007

(22) Filed: Apr. 21, 2021

(65) Prior Publication Data

US 2021/0241995 A1    Aug. 5, 2021

Related U.S. Application Data

(63) Continuation of application No. PCT/JP2019/042111, filed on Oct. 28, 2019.

(30) Foreign Application Priority Data

Nov. 9, 2018 (JP) .................. 2018-211526

(51) Int. Cl.
*H01J 37/00* (2006.01)
*G03F 7/00* (2006.01)
(Continued)

(52) U.S. Cl.
CPC ...... *H01J 37/3174* (2013.01); *G03F 7/70008* (2013.01); *G03F 7/70558* (2013.01);
(Continued)

(58) Field of Classification Search
CPC .... H01J 37/3174; H01J 37/12; H01J 37/1472; H01J 37/153; H01J 37/3026;
(Continued)

(56) References Cited

U.S. PATENT DOCUMENTS 8,129,698 B2   3/2012 Nakayamada et al.
9,355,816 B2   5/2016 Ookawa et al.
(Continued)

FOREIGN PATENT DOCUMENTS

CN   101546135 A   9/2009
CN   105027260 A   11/2015
(Continued)

OTHER PUBLICATIONS

Combined Chinese Office Action and Search Report dated May 19, 2023 in Chinese Patent Application No. 2019800676481 (with unedited computer-generated English Translation of Office Action), 7 pages.

(Continued)

*Primary Examiner* — Michael Maskell
(74) *Attorney, Agent, or Firm* — Oblon, McClelland, Maier & Neustadt, L.L.P.

(57) ABSTRACT

Position shifts caused by charging phenomena can be corrected with high accuracy. A charged particle beam writing apparatus includes an exposure-amount distribution calculator calculating an exposure amount distribution of a charged particle beam using a pattern density distribution and a dose distribution, a fogging charged particle amount distribution calculator calculating a plurality of fogging charged particle amount distributions by convoluting each of a plurality of distribution functions for fogging charged particles with the exposure amount distribution, a charge-amount distribution calculator calculating a charge amount distribution due to direct charge using the pattern density (Continued)

distribution, the dose distribution, and the exposure amount distribution, and calculating a plurality of charge amount distributions due to fogging charge using the plurality of fogging charged particle amount distributions, a position shift amount calculator calculating a position shift amount of a writing position based on the charge amount distribution due to direct charge and the plurality of charge amount distributions due to fogging charge, a corrector correcting an exposure position using the position shift amount, and a writer exposing the corrected exposure position to a charged particle beam.

14 Claims, 10 Drawing Sheets

(51) Int. Cl.
*H01J 37/12* (2006.01)
*H01J 37/147* (2006.01)
*H01J 37/153* (2006.01)
*H01J 37/302* (2006.01)
*H01J 37/317* (2006.01)
*H01L 21/027* (2006.01)

(52) U.S. Cl.
CPC .......... *H01J 37/12* (2013.01); *H01J 37/1472* (2013.01); *H01J 37/153* (2013.01); *H01J 37/3026* (2013.01); *H01L 21/0274* (2013.01); *H01J 2237/20228* (2013.01); *H01J 2237/31761* (2013.01)

(58) Field of Classification Search
CPC ... H01J 2237/20228; H01J 2237/31761; H01J 2237/31769; G03F 7/70008; G03F 7/70558; G03F 7/20; H01L 21/0274; H01L 21/0277; H01L 21/027
USPC ................................ 250/396 R, 492.1–492.3
See application file for complete search history.

(56) References Cited

U.S. PATENT DOCUMENTS

| | | |
|---|---|---|
| 2008/0265174 A1 | 10/2008 | Hiramoto et al. |
| 2009/0242787 A1 | 10/2009 | Nakayamada et al. |
| 2010/0237469 A1 | 9/2010 | Saito et al. |
| 2011/0031387 A1 | 2/2011 | Nakayamada et al. |
| 2011/0033788 A1 | 2/2011 | Kato |
| 2011/0121208 A1 | 5/2011 | Nakayamada et al. |
| 2013/0032707 A1 | 2/2013 | Nakayamada et al. |
| 2014/0061499 A1 | 3/2014 | Ogasawara et al. |
| 2016/0027611 A1 | 1/2016 | Ookawa et al. |
| 2018/0090299 A1* | 3/2018 | Nakayamada ...... H01J 37/3174 |

FOREIGN PATENT DOCUMENTS

| | | |
|---|---|---|
| JP | 03-082110 A | 4/1991 |
| JP | 2009-260250 A | 11/2009 |
| JP | 2010-250286 A | 11/2010 |
| JP | 2011-033932 A | 2/2011 |
| JP | 2011-040450 A | 2/2011 |
| JP | 2011-108968 A | 6/2011 |
| JP | 2012-44044 A | 3/2012 |
| JP | 2014-183098 A | 9/2014 |
| JP | 2017-28284 A | 2/2017 |
| JP | 2018-133552 A | 8/2018 |
| JP | 2018-148147 A | 9/2018 |

OTHER PUBLICATIONS

Office Action dated May 4, 2021 in corresponding Taiwanese Patent Application No. 108140214 (with English Translation), 5 pages.
International Search Report dated Dec. 17, 2019 in PCT/JP2019/042111 filed on Oct. 28, 2019, 2 pages.
Taiwanese Office Action dated Jan. 7, 2021 in Taiwanese Application 108140214,15 pages (with English Machine Translation).
German Office Action dated Nov. 15, 2023 in German Patent Application No. 112019005606.9 (with English Translation), 14 pages.

* cited by examiner

CHARGED PARTICLE BEAM WRITING APPARATUS, CHARGED PARTICLE BEAM WRITING METHOD, AND A NON-TRANSITORY COMPUTER-READABLE STORAGE MEDIUM

TECHNICAL FIELD

The present invention relates to a charged particle beam writing apparatus, a charged particle beam writing method, and a non-transitory computer-readable storage medium.

BACKGROUND

As LSI circuits are increasing in density, the line width of circuits of semiconductor devices is becoming finer. To form a desired circuit pattern onto a semiconductor device, a method of reducing and transferring, by using a reduction-projection exposure apparatus, onto a wafer a highly precise original image pattern (mask, or reticle, in particular, when used in a stepper or a scanner) formed on a quartz is employed. The highly precise original image pattern is written by using an electron beam writing apparatus, in which a technology commonly known as electron beam lithography is used.

In a case where a substrate such as a mask is irradiated with an electron beam, an irradiation position and its surrounding region are charged by electron beam irradiation performed in the past, and the irradiation position shifts. Hitherto, as a method to eliminate this beam irradiation position shift, a method is known in which a surface of the substrate is prevented from being charged by forming an antistatic film (a charge dissipation layer (CDL)) on the substrate. However, this antistatic film basically has acid characteristics and thus is not suitable for, for example, a case where a chemically amplified resist is applied onto the substrate. Moreover, new facilities need to be provided to form an antistatic film, thereby further increasing the manufacturing cost. Therefore, it is desired that charging effect correction (CEC) be performed without using an antistatic film.

A writing apparatus has been proposed that uses a charging effect correction method in which a charge amount distribution is obtained and a correction amount of a beam irradiation position is calculated (for example, see PTLs 1 and 2). However, there is a problem in that in some regions the conventional charging effect correction cannot sufficiently achieve a dimensional accuracy that has been recently desired.

PTL 1: Japanese Unexamined Patent Application Publication No. 2009-260250
PTL 2: Japanese Unexamined Patent Application Publication No. 2011-040450
PTL 3: Japanese Unexamined Patent Application Publication No. 2018-133552
PTL 4: Japanese Patent No. 5617947

SUMMARY OF INVENTION

The present invention aims to provide a charged particle beam writing apparatus, a charged particle beam writing method, and a program that correct a position shift caused by charging phenomena.

According to one aspect of the present invention, a charged particle beam writing apparatus writes a pattern on a substrate on a stage by causing a deflector to deflect a charged particle beam. The charged particle beam writing apparatus includes a pattern-density distribution calculator virtually dividing a writing region of the substrate in a mesh-like manner and calculating a pattern density distribution indicating an arrangement ratio of the pattern for each mesh region, a dose distribution calculator calculating a dose distribution indicating a dose for each mesh region using the pattern density distribution, an exposure-amount distribution calculator calculating an exposure amount distribution of the charged particle beam, which is emitted from an emitter and to which the substrate is exposed, using the pattern density distribution and the dose distribution, a fogging charged particle amount distribution calculator calculating a plurality of fogging charged particle amount distributions by convoluting each of a plurality of distribution functions for fogging charged particles with the exposure amount distribution, the plurality of distribution functions having different distribution centers and radius of influence of a fogging effect from each other, a charge-amount distribution calculator calculating a charge amount distribution due to direct charge using the pattern density distribution, the dose distribution, and the exposure amount distribution, and calculating a plurality of charge amount distributions due to fogging charge using the plurality of fogging charged particle amount distributions, a position shift amount calculator calculating a position shift amount of a writing position based on the charge amount distribution due to direct charge and the plurality of charge amount distributions due to fogging charge, a corrector correcting an exposure position using the position shift amount, and a writer exposing the corrected exposure position to a charged particle beam.

Advantageous Effects of Invention

According to the present invention, position shifts caused by charging phenomena can be corrected with high accuracy.

DESCRIPTION OF EMBODIMENTS

Hereinafter, an embodiment of the present invention will be described based on the drawings. In the present embodiment, a configuration using an electron beam will be described as an example of a charged particle beam. However, the charged particle beam is not limited to an electron beam, and may be an ion beam or the like.

Figure 1:
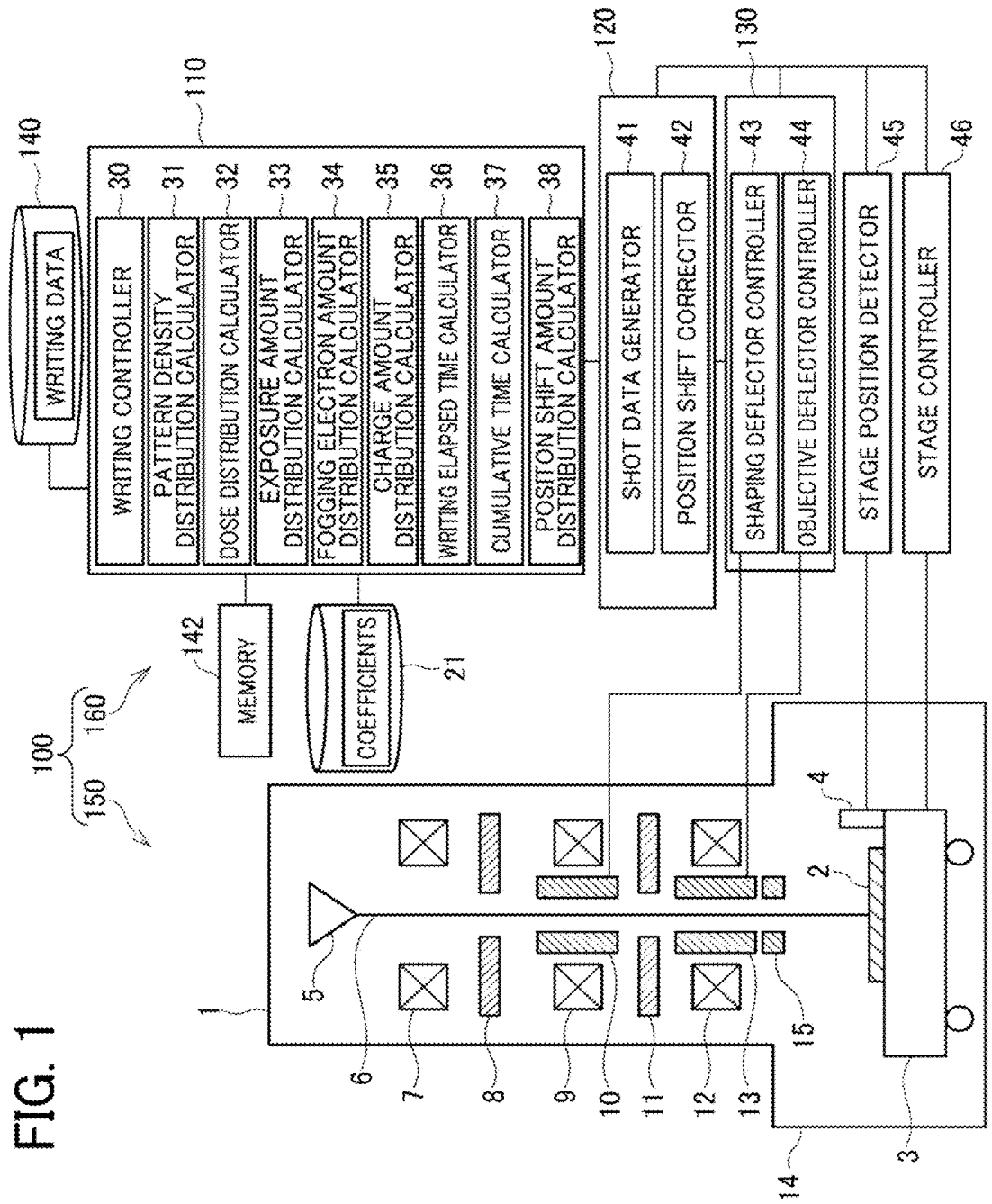
FIG. 1 is a schematic diagram of a writing apparatus according to an embodiment of the present invention.

FIG. 1 is a schematic structural diagram of a writing apparatus according to an embodiment. A writing apparatus 100 illustrated in FIG. 1 includes a writing unit 150 (a writer) and a control unit 160. The writing apparatus 100 is an example of an electron beam writing apparatus. The writing unit 150 has an electron column 1 and a writing chamber 14. In the electron column 1, an electron gun 5, an illumination lens 7, a first aperture 8, a projection lens 9, a shaping deflector 10, a second aperture 11, an objective lens 12, an objective deflector 13, and an electrostatic lens 15 are arranged.

In the writing chamber 14, an XY stage 3 is arranged. A substrate 2, which is a writing target, is arranged on the XY stage 3. The substrate 2 includes, for example, a photomask used for exposure in semiconductor manufacturing and a semiconductor wafer for forming a semiconductor device. In addition, a photomask on which writing is to be performed includes a mask blank, on which nothing has been written yet. When writing is performed, a resist layer that is exposed to an electron beam is formed on the substrate. On the XY stage 3, a mirror 4 for stage position measurement is arranged at a different position from the position where the substrate 2 is arranged.

The control unit 160 has, for example, control calculators 110 and 120, a stage position detector 45, a stage controller 46, a deflection control circuit 130, a memory 142, and storage devices 21 and 140 such as a magnetic disk device. The deflection control circuit 130 is connected to the shaping deflector 10 and the objective deflector 13.

The control calculator 110 has the functions of a writing controller 30, a pattern-density distribution calculator 31, a dose distribution calculator 32, an exposure-amount distribution calculator 33, a fogging-electron-amount distribution calculator 34, a charge-amount distribution calculator 35, a writing elapsed-time calculator 36, a cumulative time calculator 37, and a position-shift-amount distribution calculator 38. Each unit of the control calculator 110 may be configured by hardware including, for example, an electric circuit, a computer, a processor, a circuit board, a quantum circuit, or a semiconductor device or may be configured by software. In a case where each unit is configured by software, a program that realizes the function is stored in a recording medium, and a computer with a processor may read and execute the program. Data input to and calculation results from each unit of the control calculator 110 are stored in the memory 142.

The control calculator 120 has the functions of a shot data generator 41 and a position shift corrector 42. The shot data generator 41 and the position shift corrector 42 may be configured by software or hardware.

The deflection control circuit 130 has the functions of a shaping deflector controller 43 and an objective deflector controller 44. The shaping deflector controller 43 and the objective deflector controller 44 may be configured by software or hardware.

Writing data (layout data) in which a plurality of shape patterns to be written are defined is stored in the storage device 140.

An electron beam 6 emitted from the electron gun 5 (an emission unit) is caused to illuminate the entirety of the first aperture 8, which has a rectangular hole, by the illumination lens 7. Here, first, the electron beam 6 is shaped so as to have a rectangular shape. The electron beam 6 of a first aperture image that has passed through the first aperture 8 is projected onto the second aperture 11 by the projection lens 9. The position of the first aperture image on the second aperture 11 is deflected by the shaping deflector 10 controlled by the shaping deflector controller 43, so that the beam shape and size can be changed (variable shaping).

The electron beam 6 of a second aperture image that has passed through the second aperture 11 is focused by the objective lens 12, deflected by, for example, an electrostatic deflector (the objective deflector 13) controlled by the objective deflector controller 44, and applied to a desired position on the substrate 2 on the XY stage 3, which is arranged so as to be movable. The XY stage 3 is driven and controlled by the stage controller 46. The position of the XY stage 3 is detected by the stage position detector 45. The stage position detector 45 includes, for example, a laser length measurement device that irradiates the mirror 4 with laser to measure a position on the basis of the interference between incident and reflected light. The electrostatic lens 15 dynamically corrects the focus position of the electron beam 6 in accordance with the roughness of a surface of the substrate 2 (dynamic focus).

Figure 2:
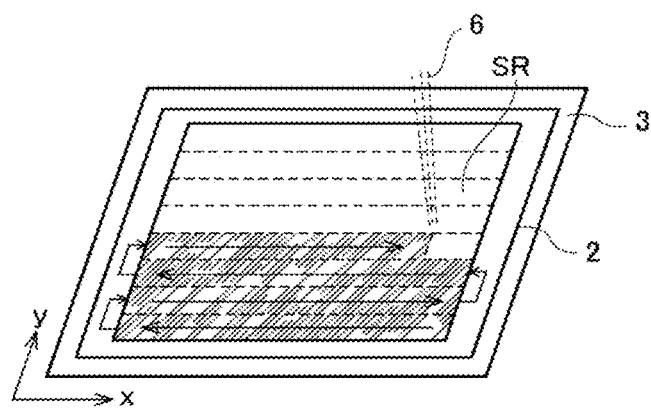
FIG. 2 is a diagram for describing the way in which a stage moves.

FIG. 2 is a diagram for describing the way in which the stage moves. In a case where writing is performed on the substrate 2, the XY stage 3 is continuously moved, for example, in the X direction. A writing region is virtually divided into a plurality of strip-shaped stripe regions (SR) having a width across which the electron beam 6 can be deflected. Writing processing is performed in units of a stripe region. Suppose that the XY stage 3, for example, continuously moves in the X direction, and the shot position of the electron beam 6 is simultaneously caused to track the stage movement. Through the continuous movement, a writing time can be shortened.

After writing in one stripe region is finished, the XY stage 3 is step fed in the Y direction, and a writing operation is performed in the next stripe region in the X direction (the opposite direction). The travel time of the XY stage 3 can be shortened by performing the writing operation for the individual stripe regions in a meandering manner.

In the writing apparatus 100, in order to process layout data (writing data), the writing region is virtually divided into a plurality of strip-shaped frame regions, and data processing is performed on a frame region basis. In a case where multiple exposures are not performed, normally, the frame regions are the same as the stripe regions. In a case where multiple exposures are performed, the frame regions do not match the stripe regions in accordance with the level of multiplicity. In this manner, the writing region of the substrate 2 is virtually divided into the plurality of frame regions (stripe regions), which are a plurality of writing unit regions, and the writing unit 150 performs writing on a frame region (stripe region) basis.

It is known that when the resist layer of the substrate 2 is exposed to an electron beam, the beam exposure position (irradiation position) shifts due to the resist charging effect. In conventional charging effect correction, an exposure amount distribution of an electron beam to which the substrate 2 is exposed is calculated, a fogging electron amount distribution is calculated on the basis of a spreading distribution of fogging electrons spreading from an exposure range (irradiation range) to be exposed to an electron beam to a non-exposure range, and a charge amount distribution of the exposure range and a charge amount distribution of the non-exposure range are calculated using the exposure amount distribution and the fogging electron amount distribution. A position shift amount distribution of the electron beam on the substrate 2 is then calculated from the charge amount distribution of the irradiation range and the charge amount distribution of the non-irradiation range, and the beam irradiation position is corrected.

However, the irradiation position is not sufficiently corrected in the conventional charging effect correction. As described later, the present inventors found that a beam irradiation position shift can be corrected with high accuracy on the basis of a model in which the center position of a fogging electron distribution and the radius affected by the fogging effect vary depending on the energy of fogging electrons.

Figure 3A:
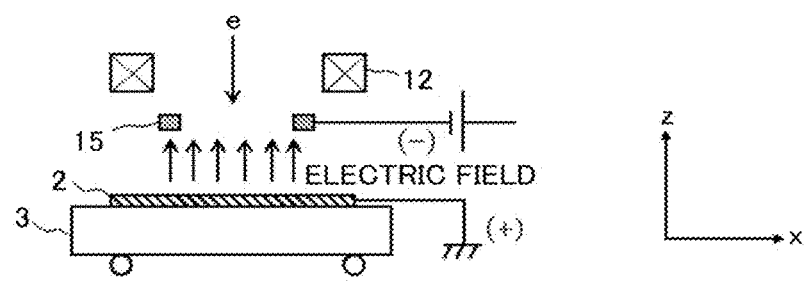
FIGS. 3A and 3B are diagrams for describing a hypothesized mechanism for generating fogging electrons for which the center of the distribution is shifted.

FIG. 3A is a diagram for describing a hypothesized mechanism with which a plurality of different fogging electron distributions exist in the present embodiment. In FIG. 3A, a surface of the substrate 2 is maintained at a ground potential. In contrast, a negative potential is applied to the electrostatic lens 15, which is arranged above the substrate 2. Thus, from the surface of the substrate 2 to an elevation plane in which the electrostatic lens 15 is arranged, an electric field is generated in which the electric lines of force extend from the surface of the substrate 2 toward the electrostatic lens 15 (in the z direction). In a case where the direction of such an electric field is tilted due to, for example, an error and/or a case where a fringing electric field is further generated, a difference in potential is generated between right and left positions (the x direction) on the substrate 2, and a lateral electric field is generated.

Figure 3B:
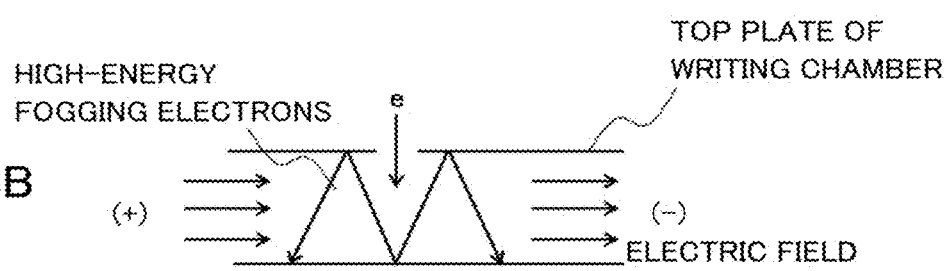

The energy of the electron beam 6 (e) itself is high and thus is not bent by this electric field. In addition, the fogging electrons scattered elastically by the substrate 2 and the top plate of the writing chamber 14 and falling down onto the substrate 2 also have high energy and thus are not bent by this electric field as illustrated in FIG. 3B.

Figure 4A:
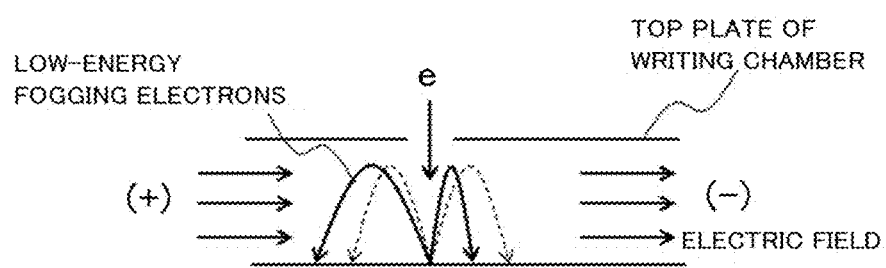
FIGS. 4A and 4B are diagrams for describing a hypothesized mechanism for generating fogging electrons for which the center of the distribution is shifted.
Figure 4B:
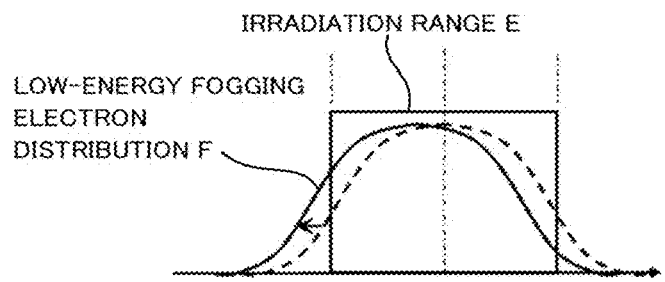

However, secondary electrons generated by beam irradiation to the substrate 2 and repelled toward the substrate 2 by the electric field caused by the electrostatic lens in the z direction have low energy and thus, as illustrated in FIG. 4A, are affected by the lateral electric field and shift toward the positive potential side. As a result, as illustrated in FIG. 4B, the center of the distribution of fogging electrons F shifts from the center of an irradiation range E.

Figure 5A:
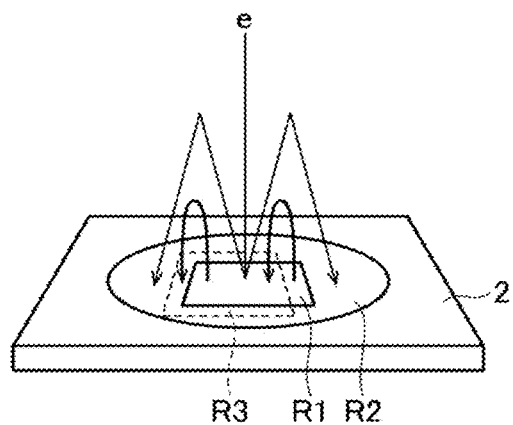
FIGS. 5A and 5B are diagrams illustrating an example of fogging electron charge on a fogging electron energy basis.

Thus, the present inventors found, using this mechanism, that a beam irradiation position shift can be corrected with high accuracy by using a charge model including direct charge R1 caused by an applied electron beam (e), fogging electron charge R2 by high-energy fogging electrons falling down onto the substrate 2 due to elastic scattering caused by the substrate 2 and the top plate of the writing chamber 14, and fogging electron charge R3 by low-energy fogging electrons falling down onto the substrate such that the low-energy fogging electrons, which are generated by beam irradiation to the substrate 2, are repelled by the potential of the electrostatic lens 15 as illustrated in FIG. 5A.

Figure 5B:
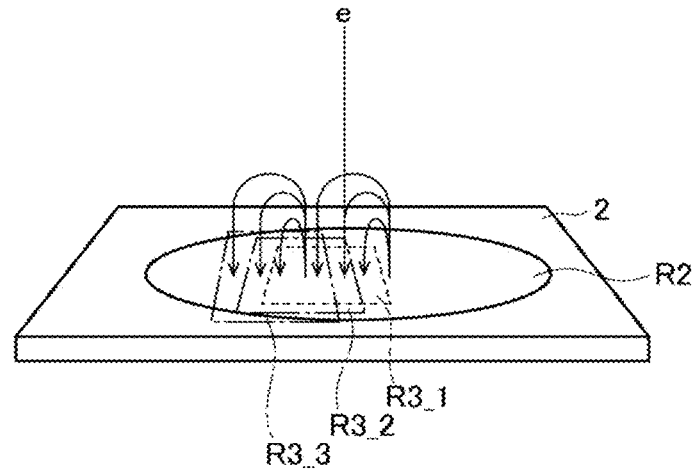

In addition, it is assumed that the secondary electrons, which are generated by beam irradiation to the substrate 2, include electrons of various energies. Therefore, it is conceivable that fogging electrons have different trajectories depending on their energy and reach different positions on the substrate. FIG. 5B illustrates an example in which different fogging electron charges R3_1 to R3_3 are caused due to differences in fogging electron energy.

In the present embodiment, charging effect correction is performed using a plurality of fogging electron amount distributions in a manner that takes into consideration such a model.

Figure 6:
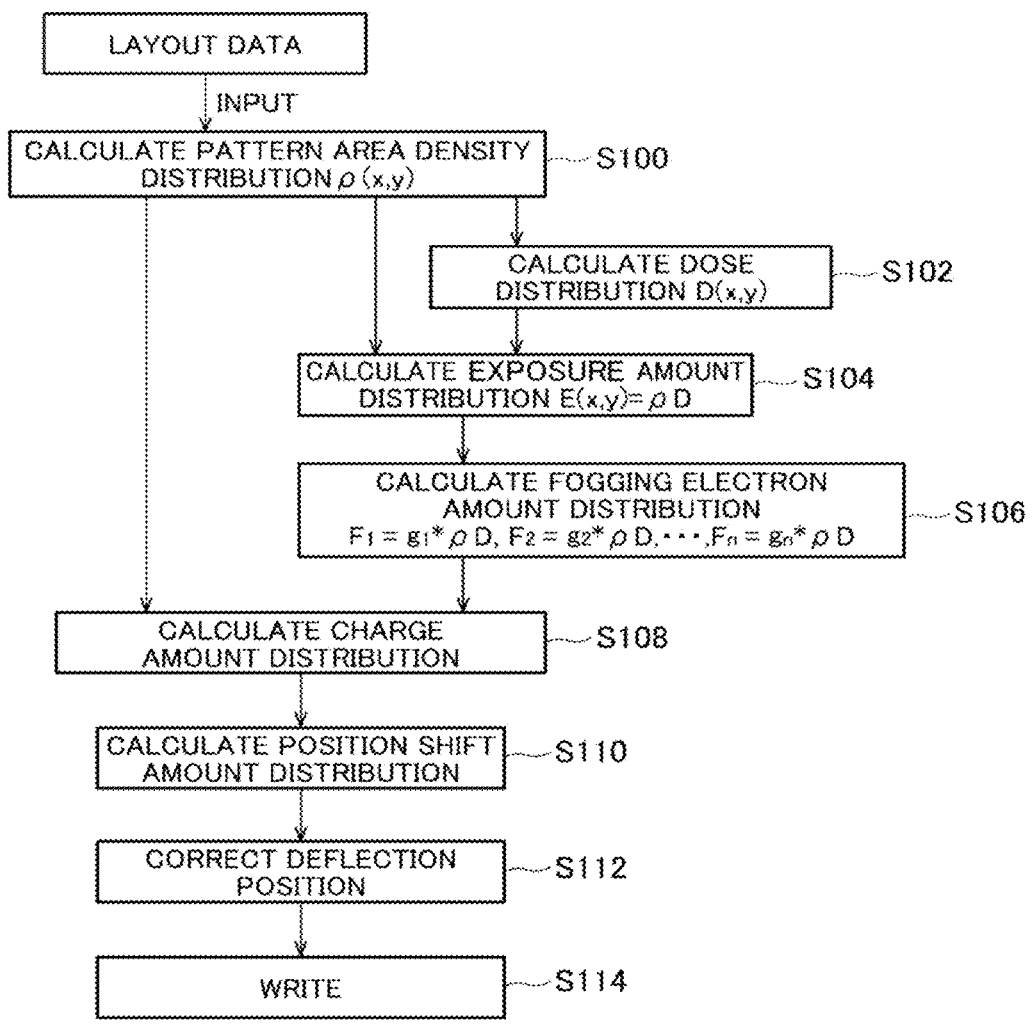
FIG. 6 is a flow chart for describing a writing method according to the same embodiment.

FIG. 6 is a flow chart for describing a writing method according to the present embodiment. This writing method has a pattern-area-density distribution arithmetic step (step S100), a dose distribution calculation step (step S102), an exposure-amount distribution calculation step (step S104), a fogging-electron-amount distribution calculation step (step S106), a charge-amount distribution calculation step (step S108), a position-shift-amount distribution calculation step (step S110), a deflection position correction step (step S112), and a writing step (step S114).

In the pattern-area-density distribution arithmetic step (step S100), the pattern-density distribution calculator 31 reads out writing data from the storage device 140, virtually divides the writing region (or the frame region) in a mesh-like manner so as to have predetermined dimensions (grid dimensions), and calculates, on a mesh region basis, a pattern area density p(x, y) indicating the arrangement ratio of a shape pattern defined in the writing data. For each mesh region, a pattern density distribution p(x, y) is then generated.

In the dose distribution calculation step (step S102), for each mesh region, the dose distribution calculator 32 calculates a dose distribution D(x, y) using the pattern density distribution p(x, y). To calculate a dose, it is preferable that proximity effect correction based on backscattered electrons be performed. A dose D can be defined by the following Eq. (1).

$$D = D_0 \times \{(1 + 2 \times \eta)/(1 + 2 \times \eta \times \varphi)\} \quad (1)$$

In Eq. (1), $D_0$ is a standard dose, and $\eta$ is a back-scattering rate.

The standard dose $D_0$ and the back-scattering rate $\eta$ are set by the user of the writing apparatus 100. The back-scattering rate $\eta$ can be set by considering, for example, an acceleration voltage applied to the electron beam 6, the thickness of a resist film of the substrate 2, the type of base substrate, and process conditions (for example, PEB conditions and development conditions).

In the exposure-amount distribution calculation step (step S104), the exposure-amount distribution calculator 33 calculates, for each mesh region, an exposure amount distribution E(x, y) (also referred to as "exposure intensity distribution") by multiplying each mesh value of the pattern density distribution ρ(x, y) by a corresponding mesh value of the dose distribution D(x, y).

In the fogging-electron-amount distribution calculation step (step S106), the fogging-electron-amount distribution calculator 34 (a fogging charged particle amount distribution arithmetic unit) calculates a fogging electron amount distribution F (a fogging charged particle amount distribution) by convoluting a distribution function g of fogging electrons with the exposure amount distribution E=ρD calculated in step S104.

In the present embodiment, a plurality of distribution functions $g_1$ to $g_n$ are used in accordance with the energy of fogging electrons. Thus, a plurality of fogging electron amount distributions $F_1$ to $F_n$ are calculated in accordance with the energy of the fogging electrons. For the distribution functions $g_1$ to $g_n$, for example, a Gaussian distribution can be used. Fogging electrons are affected by the electric field generated on the substrate 2, and the arrival positions of the fogging electrons shift on the substrate 2. Moreover, the amounts of shift of the arrival positions differ depending on the energy of the fogging electrons. Thus, the distribution functions $g_1$ to $g_n$ may differ from each other in terms of the distribution center position and the radius affected by the fogging effect. That is, the j-th distribution function $g_j(x, y)$ and the j-th fogging electron distribution $F_j(x, y)$ can be individually defined in the following equations.

$$g_j(x,y)=(1/\pi\sigma_j^2)\times\exp[-\{(x-\Delta x_j)^2+(y-\Delta y_j)^2\}/\sigma_j^2] \quad (2)$$

$$F_j(x,y)=\iint g_j(x-x',y-y')E(x',y')dx'dy' \quad (3)$$

In Eq. (2), $\Delta x_j$ and $\Delta y_j$ are the distribution center position of the j-th fogging electron distribution, and a, is a constant expressing the radius affected by the j-th fogging electrons.

In the charge-amount distribution calculation step (step S108), the charge-amount distribution calculator 35 calculates a charge amount distribution C(x, y) using the exposure amount distribution E, the fogging electron amount distributions $F_1$ to $F_n$, and a charge decay amount over time.

First, an elapsed time t after writing (irradiation) is performed on a charged portion is calculated. The writing elapsed-time calculator 36 calculates, for each position on the substrate 2, an elapsed time T1(x, y) from a writing start time (a time when writing of the start of the layout or the top frame is started) to a time when writing is actually started. For example, in a case where a subject frame region (stripe region) is the i-th frame region, a time estimated from the writing start time, at which writing at a writing start position is started, to when writing is performed at each position (x, y) in the (i−1)-th frame region (stripe region), which is the previous frame, is calculated as an elapsed time T1(x, y).

Next, the cumulative time calculator 37 calculates a cumulative time T2 obtained by accumulating writing times spent to write in writing unit regions (for example, frame regions, stripe regions) in which writing has already been finished. For example, in a case where currently the subject frame region is the i-th frame region, an addition value is calculated that is obtained by adding, in a cumulative manner, a time T2(1) for performing writing in the first frame region, a time T2(2) for performing writing in the second frame region, . . . , and a time T2(i) for performing writing in the i-th frame region. As a result, the cumulative time T2 to the subject frame region can be obtained.

Here, in a case where writing is actually performed in the currently processed subject frame region, since writing has already been completed in the frame regions up to the previous frame region, portions irradiated with the electron beam 6 in the frame regions up to the previous frame region are charged portions. Thus, a difference value (T2−T1) obtained by subtracting the writing elapsed time T1(x, y) of each position (x, y) in the previous frame region having charged portions from the cumulative time T2 of the subject frame region is the elapsed time t after writing performed in the charged portions.

A function for obtaining a charge amount distribution C(x, y) includes a direct charge term affected by irradiation electrons and a fogging charge term affected by fogging electrons. In accordance with the energy of fogging electrons, a plurality of fogging charge terms are included. Each of the direct charge term and the plurality of fogging charge terms includes a decay term affected by an elapsed time and a static term not affected by the elapsed time. In each of the decay terms, a charge decay amount and a charge decay time constant are used, the charge decay amount being a charge amount obtained immediately after writing with reference to a charge amount obtained after a sufficient time has elapsed after writing.

It is conceivable that a charge amount trapped in a resist and corresponding to the probability of affecting resist charge, that is, a fogging electron intensity varies depending on the energy of a fogging electron. Moreover, it is conceivable that its decay time constant and decay amount vary in a similar manner. Thus, first, suppose a function $C(E, F_1, F_2, \ldots, F_n, t)$ for obtaining the charge amount distribution C(x, y). Specifically, the function $C(E, F_1, F_2, \ldots, F_n, t)$ is separated into a variable $C_E(E, t)$ affected by irradiation electrons and variables $C_{F1}(F_1, t)$ to $C_{Fn}(F_n, t)$ affected by fogging electrons. Furthermore, the variables are individually separated into decay terms $C_{ET}(t)$ and $C_{FT1}(t)$ to $C_{FTn}(t)$ affected by an elapsed time and static terms $C_{ES}(E)$ and $C_{FS1}(F_1)$ to $C_{FSn}(F_n)$ not affected by the elapsed time. The function $C(E, F_1, F_2, \ldots, F_n, t)$ is defined by the following Eq. (4).

$$\begin{aligned}C(x,y) &= C(E, F_1, F_2, \ldots, F_n, t) \\ &= C_E(E, t) + \sum_j C_{Fj}(F_j, t) \\ &= C_{ES}(E) + C_{ET}(t) + \sum_j C_{FSj}(F_j) + \sum_j C_{FTj}(t)\end{aligned} \quad (4)$$

Moreover, the variables $C_{ES}(E)$, $C_{ET}(t)$, $C_{FSj}(F_j)$, and $C_{FTj}(t)$ are defined by the following Eqs. (5), (6), (7), and (8).

$$C_{ES}(E)=d_0+d_1\times\rho+d_2\times D+d_3\times E \quad (5)$$

$$C_{ET}(t)=\kappa_E(\rho)\cdot\exp\{-t/\lambda_E(\rho)\} \quad (6)$$

$$C_{FSj}(F_j)=f_{1,j}\times F_j+f_{2,j}\times F_j^2+f_{3,j}\times F_j^3 \quad (7)$$

$$C_{FTj}(t)=\kappa_{Fj}(\rho)\cdot\exp\{-t/\lambda_{Fj}(\rho)\} \quad (8)$$

Here, $d_0$, $d_1$, $d_2$, and $d_3$ are constants. In addition, $f_{1,1}$, $f_{2,1}$, $f_{3,1}$, . . . , $f_{1,n}$, $f_{2,n}$, and $f_{3,n}$ are constants that may have different values from each other, and express that the effect of a fogging electron intensity Fj on charge varies depending on the energy of fogging electrons.

Moreover, charge decay amounts $\kappa_E(\rho)$ and $\kappa_{Fj}(\rho)$ used in Eqs. (6) and (8) and depending on the pattern area density ρ can be approximated as, for example, the following Eqs. (9) and (10). In this case, Eqs. (9) and (10) are quadratic functions; however, the equations are not limited thereto and may be a higher-order or lower-order function.

$$\kappa_E(\rho)=\kappa_{E0}+\kappa_{E1}\rho+\kappa_{E2}\rho^2 \quad (9)$$

$$\kappa_{Fj}(\rho)=\kappa_{F0,j}+\kappa_{F1,j}\rho+\kappa_{F2,j}\rho^2 \quad (10)$$

Here, $\kappa_{E0}$, $\kappa_{E1}$, and $\kappa_{E2}$ are constants. In addition, $\kappa_{F0,1}$, $\kappa_{F1,1}$, $\kappa_{F2,1}$, . . . , $\kappa_{F0,n}$, $\kappa_{F1,n}$, and $\kappa_{F2,n}$ are constants that may have different values from each other and express that the charge decay amount varies depending on the energy of fogging electrons.

Charge decay time constants $\lambda_E(\rho)$ and $\lambda_{Fj}(\rho)$ used in Eq. (4) and depending on the pattern area density p can be approximated as, for example, the following Eqs. (11) and (12). In this case, Eqs. (11) and (12) are quadratic functions; however, the equations are not limited thereto and may be a higher-order or lower-order function.

$$\lambda_E(\rho)=\lambda E_0+\lambda E_1\rho+\lambda E_2\rho^2 \quad (11)$$

$$\lambda_{Fj}(\rho)=\lambda_{F0,j}+\lambda_{F1,j}\rho+\lambda_{F2,j}\rho^2 \quad (12)$$

Figure 7:
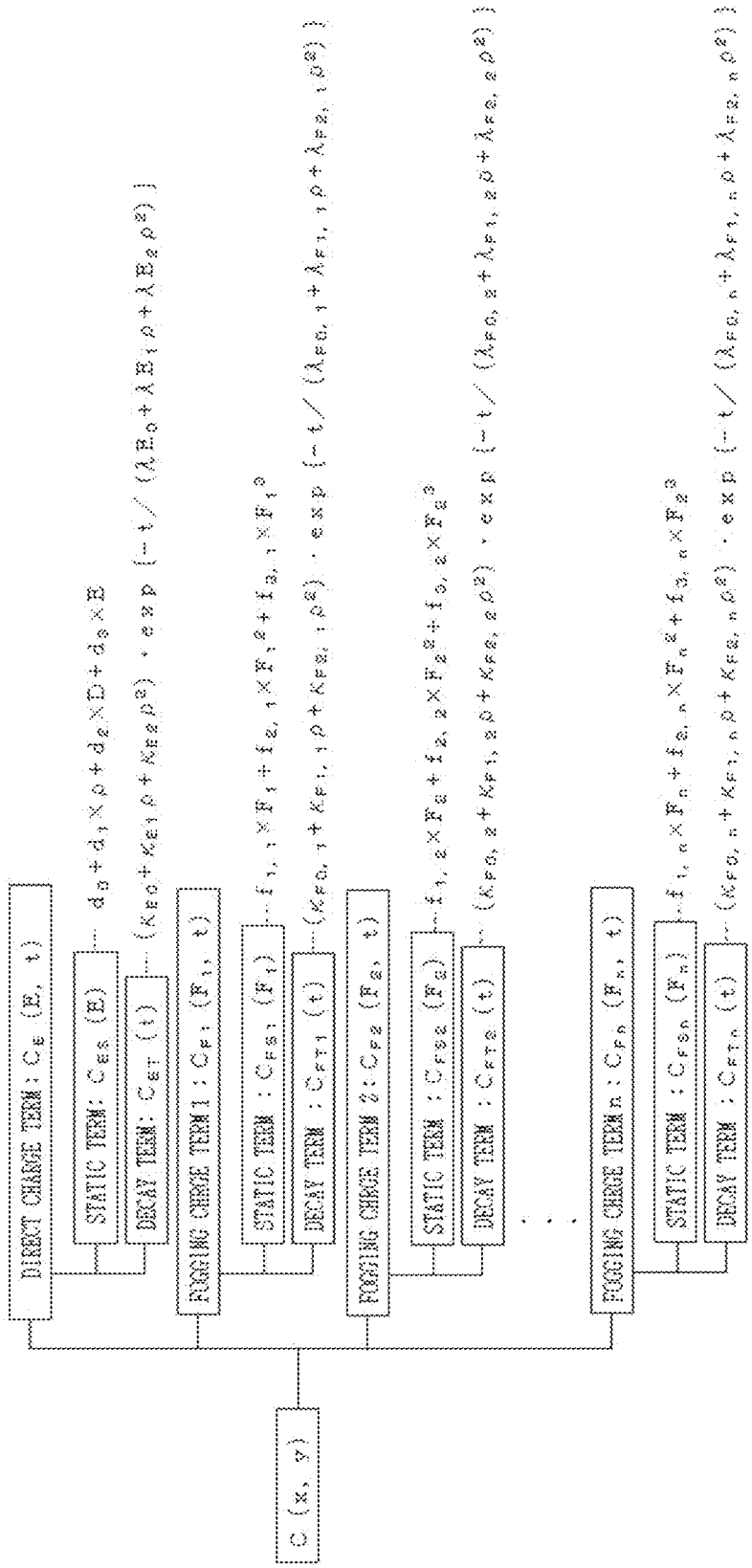
FIG. 7 is a diagram illustrating mathematical expressions described by generalizing a charge amount distribution.

Here, $\lambda_{E0}$, $\lambda_{E1}$, and $\lambda_{E2}$ are constants. In addition, $\lambda_{F0,1}$, $\lambda_{F1,1}$, $\lambda_{F2,1}$, ..., $\lambda_{F0,n}$, $\lambda_{F1,n}$, and $\lambda_{F2,n}$ are constants that may have different values from each other and express that the charge decay time constant varies depending on the energy of fogging electrons. That is, the charge amount distribution C(x, y) can be defined by expressions as illustrated in FIG. 7.

Note that, similarly to as in the above-described PTLs 1, 2, and 3, each fogging charge term may further be separated into terms regarding an irradiation portion and a non-irradiation portion.

It is sufficient that, similarly to as in the above-described PTLs 1, 2, and 3, coefficients of Eqs. (2), (3), (5), (7), and (9) to (12) be obtained by fitting (approximating) experimental results and/or simulation results, the coefficients being $\Delta x_1, \Delta x_2, \ldots, \Delta x_n, \Delta y_1, \Delta y_2, \ldots, \Delta y_n, d_0, d_1, d_2, d_3, f_{1,1}, f_{2,1}, f_{3,1}, \ldots, f_{1,n}, f_{2,n}, f_{3,n}, \kappa_{E0}, \kappa_{E1}, \kappa_{E2}, \kappa_{F0,1}, \kappa_{F1,1}, \kappa_{F2,1}, \ldots, \kappa_{F0,n}, \kappa_{F1,n}, \kappa_{F2,n}, \lambda_{E0}, \lambda_{E1}, \lambda_{E2}, \lambda_{F0,1}, \lambda_{F1,1}, \lambda_{F2,1}, \ldots, \lambda_{F0,n}, \lambda_{F1,n}$, and $\lambda_{F2,n}$. Data regarding these coefficients is stored in the storage device 21.

Figure 8:
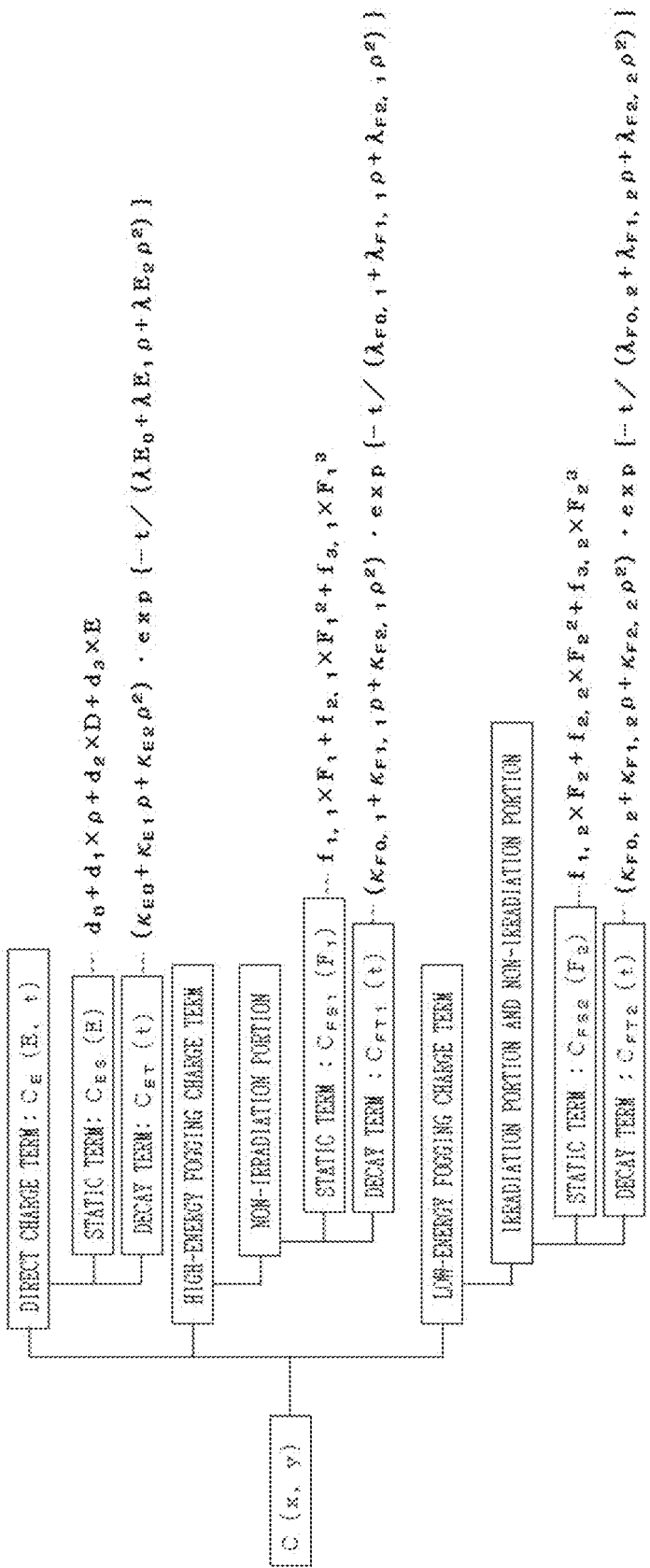
FIG. 8 is a diagram illustrating mathematical expressions describing an example of a charge amount distribution.

In the case of the model as illustrated in FIG. 5A and considering charge due to high-energy fogging electrons and charge due to low-energy fogging electrons, a charge amount distribution can be defined by expressions as illustrated in FIG. 8. Here, suppose that charge due to high-energy fogging electrons charges only a non-irradiation portion, and charge due to low-energy fogging electrons charges an irradiation portion and the non-irradiation portion.

In the position-shift-amount distribution calculation step (step S110), the position-shift-amount distribution calculator 38 (a position-shift-amount arithmetic unit) calculates a position shift amount based on the charge amount distribution. Specifically, the position-shift-amount distribution calculator 38 calculates a position shift amount P of a writing position (x, y) due to the charge amount at each position (x, y) of the charge amount distribution C(x, y) by convoluting the charge amount distribution calculated in step S108 with a response function r(x, y).

Suppose that the response function r(x, y) converts this charge amount distribution C(x, y) into a position shift amount distribution P(x, y). Here, a charge position indicated by each position of the charge amount distribution C(x, y) is expressed as (x', y'), and a beam irradiation position of a subject frame region (for example, the i-th frame region) on which data processing is currently performed is expressed as (x, y). Here, a beam position shift can be expressed as a function of the distance from a beam irradiation position (x, y) to a charge position (x', y'), and thus the response function can be described as r(x−x', y−y'). It is sufficient that the response function r(x−x', y−y') be obtained in advance so as to match the result of an experiment performed in advance or be obtained in advance through a numerical calculation similarly to as in the above-described PTLs 1 and 2. In the following, (x, y) represents a beam irradiation position of a subject frame region on which data processing is currently performed.

The position-shift-amount distribution calculator 38 then generates a position shift amount distribution Pi(x, y) (or also referred to as a position shift amount map Pi(x, y)) from the position shift amount P of each position (x, y) at which writing is to be performed in the subject frame region. The calculated position shift amount map Pi(x, y) is stored in the storage device 21 and also output to the control calculator 120.

In contrast, in the control calculator 120, the shot data generator 41 reads out the writing data from the storage device 140 and generates shot data in a format unique to the writing apparatus 100 by performing multistage data conversion processing. The size of a shape pattern defined in the writing data is normally larger than the shot size that can be formed by the writing apparatus 100 in one shot. Thus, in the writing apparatus 100, each shape pattern is divided into a plurality of shot shapes so as to have a size that can be formed by the writing apparatus 100 in one shot (shot division). For each shot shape, data such as a shape code indicating a shape type, coordinates, and a size are defined as shot data.

In the deflection position correction step (step S112) (a position shift correction process), the position shift corrector 42 corrects an irradiation position using the position shift amount calculated in step S110. Here, the shot data for each position is corrected. Specifically, to each position (x, y) of the shot data, a correction value for correcting a position shift amount indicated by the position shift amount map Pi(x, y) is added. It is preferable that, for example, a value obtained by inverting the positive/negative sign of the position shift amount indicated by the position shift amount map Pi(x, y) be used as the correction value. As a result, in a case where irradiation with the electron beam 6 is performed, the coordinates of the irradiation destination are corrected, and thus the deflection position to which the beam is deflected by the objective deflector 13 is corrected. Pieces of shot data are defined in a data file such that the pieces of shot data are sorted in shot order.

In the writing step (step S114), in shot order in the deflection control circuit 130, the shaping deflector controller 43 calculates, for each shot shape, the amount of deflection of the shaping deflector 10 for variable shaping of the electron beam 6 from the shape type and size defined in the shot data. Moreover, the objective deflector controller 44 calculates the amount of deflection of the objective deflector 13 for deflecting the subject shot shape to an irradiation position on the substrate 2. In other words, the objective deflector controller 44 (a deflection amount arithmetic unit) calculates the amount of deflection for deflecting the electron beam to a corrected irradiation position. The objective deflector 13 arranged in the electron column 1 then deflects the electron beam in accordance with the calculated amount of deflection to irradiate the corrected irradiation position with the electron beam. As a result, the writing unit 150 writes the pattern at the position subjected to charge correction on the substrate 2.

Figure 9A:
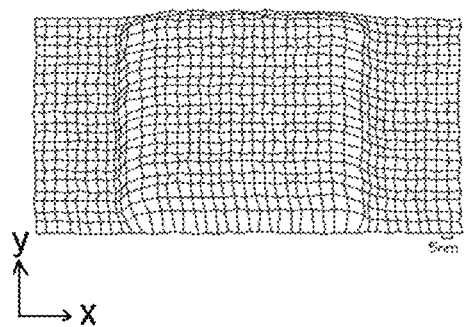
FIG. 9A is a diagram illustrating an example of a result of writing.
Figure 9B:
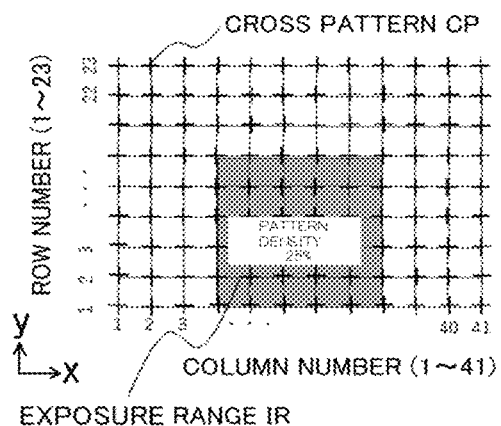
FIG. 9B is a diagram illustrating a written pattern.

FIG. 9 includes diagrams illustrating an example of a result of writing in a beam irradiation portion and its surrounding portion in the present embodiment. As illustrated in FIG. 9B, a pattern having a pattern density of 25% is written on an irradiation range IR, and thereafter cross patterns CP for position measurement are written on a grid on which 41 CPs are arranged in the x direction (the column direction) and 23 CPs are arranged in the y direction (the row direction) with a constant pitch across the irradiation range/non-irradiation range. FIG. 9A illustrates, for each cross pattern CP on the grid, a position shift amount from the position determined through design on the grid (a position error map). In FIG. 9A, the outline of a region obtained by adding the beam irradiation range and its surrounding range advances in a rectangular shape.

Figure 10A:
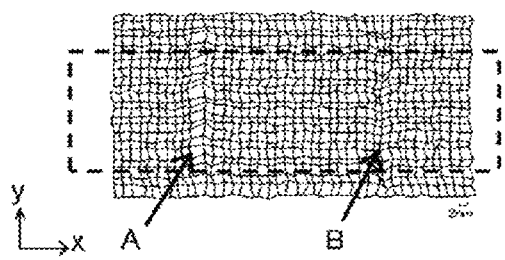
FIG. 10A is a diagram illustrating an example of a result of writing in a comparative example.
Figure 10B:
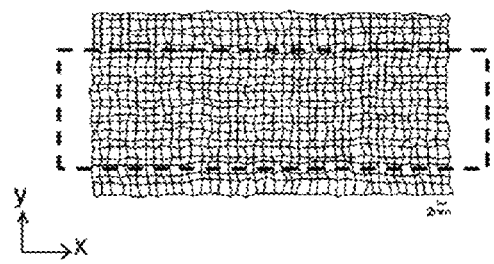
FIG. 10B is a diagram illustrating an example of a result of writing in the embodiment.

FIG. 10A illustrates an example of the position error map in a case where, similarly to as in a conventional charge correction method, differences in the energy of fogging electrons are not considered and the irradiation position is corrected on the basis of a charge amount distribution including only one fogging charge term. In FIG. 10A, it is clear that a left-end region A and a right-end region B in the irradiation range include a region having large irradiation residuals. It is conceivable that this happens because a position shift due to the charge R3 by low-energy fogging electrons in FIG. 5A cannot be reproduced through a position shift calculation based on the charge amount distribution including only one fogging charge term. FIG. 10B illustrates an example of the position error map in a case where writing is performed using a writing method according to the present embodiment. It is clear that, compared with FIG. 10A, correction residuals have been reduced.

Figure 11A:
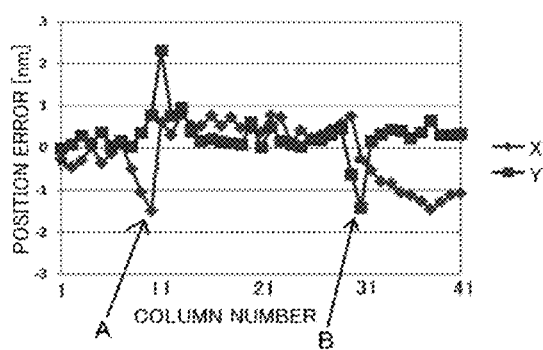
FIG. 11A is a graph illustrating writing position errors in the comparative example.
Figure 11B:
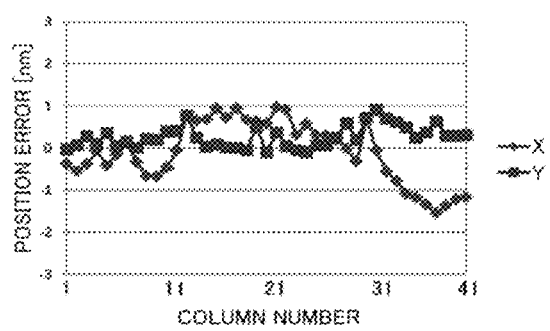
FIG. 11B is a graph illustrating writing position errors in the embodiment.

FIGS. 11A and 11B are graphs illustrating position errors in broken-line regions of FIGS. 10A and 10B. The position errors are calculated by averaging, for each column number, pieces of row data from row number 4 to 21. It was confirmed that, in the regions A and B, the correction residuals can be reduced to about ±1 nm by the method according to the present embodiment from about ±2 nm in a case where the differences in the energy of fogging electrons are not considered.

In this manner, according to the present embodiment, a charge amount distribution due to high-energy fogging electrons and a charge amount distribution due to low-energy fogging electrons are separately calculated to obtain a position shift amount distribution. Thus, position shifts caused by charging phenomena can be corrected with high accuracy.

In the present embodiment, it is hypothesized that a plurality of fogging electron distributions exist due to the differences in the energy of electrons. The present invention can also be applied to a case where a plurality of fogging electron distributions exist due to the structure of the optical system or the structure of the apparatus. For example, the present invention can also be applied to, for example, a case where fogging electrons falling into the writing chamber 14 through different trajectories from that of the electron beam 6 are present in addition to high-energy fogging electrons described above in the electron column 1 after a portion of the electron beam 6 is reflected diffusely in the apertures and the electron column and a case where fogging electrons falling onto the substrate are present in addition to high-energy fogging electrons described above because some of high-energy fogging electrons are scattered in an asymmetric manner due to an asymmetric structure near the top plate of the writing chamber 14. For example, the fogging electron amount distributions are calculated using distribution functions corresponding to these fogging electrons.

In the above-described embodiment, the example has been described in which the plurality of distribution functions $g_1$ to $g_n$ corresponding to the energy of fogging electrons have different distribution center positions and different radii affected by the fogging effect from each other but the distribution center positions and radii are constant (during writing); however, regarding the distribution functions corresponding to low-energy fogging electrons, for example, the distribution center position and the affected radius may be newly calculated in units of a frame region on the basis of the charge amount distribution.

The low-energy fogging electrons are subjected to a fringing magnetic field due to the objective lens 12 and performs cyclotron motion. This cyclotron motion is a drift in a direction based on the fringing magnetic field and the electric field generated by the charge in a region where writing has been performed (so-called E-cross-B drift). Thus, regarding the distribution functions corresponding to the low-energy fogging electrons, it is preferable that the distribution center positions and affected radii be determined on the basis of the charge amount distribution (the size and direction of the electric field calculated on the basis of the writing history). High-energy fogging electrons do not perform cyclotron motion since they are fast in speed, and the amount of deflection caused by the electric field formed by the charge in the region where writing has been performed is sufficiently small. Thus, suppose that, regarding the distribution function corresponding to the high-energy fogging electrons, the distribution center position is the center of a distribution by design (a beam irradiation position) and the distribution center position and affected radius are constant.

Figure 12:
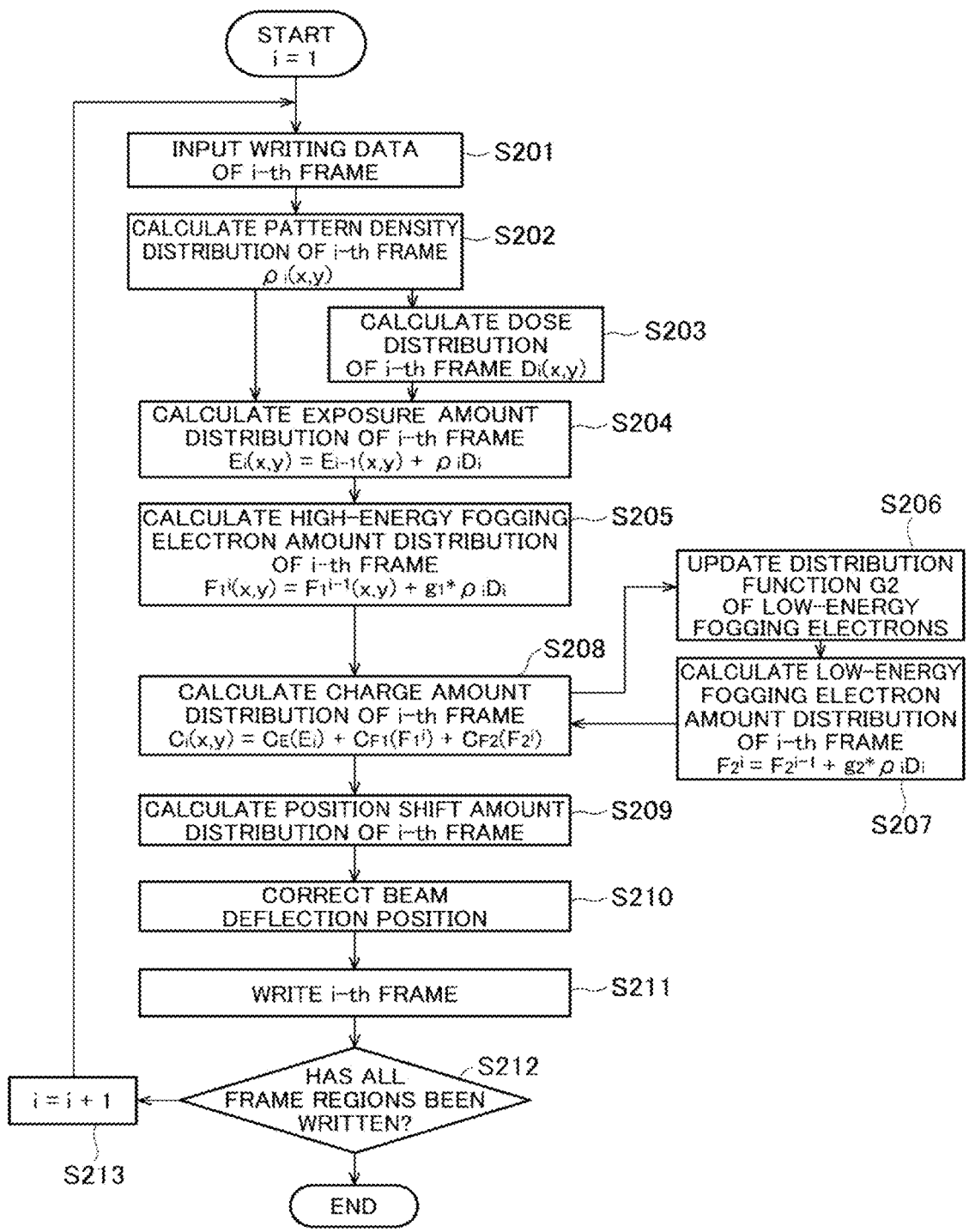
FIG. 12 is a flow chart for describing a writing method according to another embodiment.

FIG. 12 is a flow chart for describing a method in which writing is performed while a distribution function corresponding to low-energy fogging electrons is being updated. Writing data of the i-th frame region is read out, the pattern area density of each mesh region is calculated, and the pattern density distribution $\rho_i(x, y)$ is generated (steps S201 and S202).

For each mesh region, a dose distribution $D_i(x, y)$ is calculated using the pattern density distribution $\rho_i(x, y)$ (step S203). Each mesh value of the pattern density distribution $\rho_i(x, y)$ is multiplied by a corresponding mesh value of the dose distribution $D_i(x, y)$, and an exposure amount distribution $E_{i-1}(x, y)$ of the (i-1)-th frame region is added to the multiplication result to calculate an exposure amount distribution $E_i(x, y)$ of the i-th frame region (step S204).

The distribution function $g_1$ for high-energy fogging electrons and $\rho_i D_i$ are convoluted, and a high-energy fogging electron amount distribution $F_1^{i-1}(x, y)$ of the (i-1)-th frame region is added to the calculation result to calculate a high-energy fogging electron amount distribution $F_1^i(x, y)$ of the i-th frame region (step S205). Regarding the distribution function $g_1$ for high-energy fogging electrons, the center of the distribution and the affected radius are constant during the calculation process illustrated in the flow chart.

The amount of shift of the center and the affected radius of the distribution function $g_2$ for low-energy fogging electrons are updated on the basis of the charge amount distribution $C_{i-1}(x, y)$ of the (i-1)-th frame region, which has already been calculated, (step S206). The updated distribution function $g_2$ for low-energy fogging electrons and $\rho_i D_i$ are convoluted, and a low-energy fogging electron amount distribution $F_2^{i-1}(x, y)$ of the (i-1)-th frame region is added to the calculation result to calculate a low-energy fogging electron amount distribution $F_2^i(x, y)$ of the i-th frame region (step S207). In this manner, the distribution function $g_2$ for low-energy fogging electrons is updated during the calculation process illustrated in the flow chart.

A direct charge term $C_E(E_i)$ using the exposure amount distribution $E_i$, a high-energy fogging charge term $C_{F1}(F_1^i)$ using the high-energy fogging electron amount distribution $F_1^i$, and a low-energy fogging charge term $C_{F2}(F_2^i)$ using the low-energy fogging electron amount distribution $F_2^i$ are added to calculate a charge amount distribution $C_i(x, y)$ of the i-th frame region (step S208).

A position shift amount distribution of the i-th frame region is calculated from the charge amount distribution $C_i(x, y)$ (step S209). A beam deflection position is corrected using the calculated position shift amount, and writing is performed in the i-th frame region (steps S210 and S211). For all the frame regions, the above-described processes are performed in order (steps S201 to S213).

In this manner, when the position shift amount distribution of the i-th frame region is generated, the distribution center position and the affected radius of the distribution function corresponding to low-energy fogging electrons are determined (updated) using the charge amount distribution obtained in the state in which writing is completed in the frame regions up to the (i−1)-th frame region. The low-energy fogging electron amount distribution in processing of the i-th frame region is calculated using the post-update distribution function.

The distribution center position and the affected radius of the distribution function are determined, for example, from calculation results of the strength and direction of electrostatic force in the xy plane direction at the i-th frame position, the calculation using the charge amount distribution obtained in the state in which writing is completed in the frame regions up to the (i−1)-th frame region. For this electrostatic force, the relationship between the distribution center position and the affected radius is determined by performing, for example, a trajectory simulation on low-energy secondary electrons generated on an axis under a z-direction electric field distribution on an axis determined through designing the electrostatic lens, a z-direction magnetic field distribution on an axis determined through designing the objective lens, and an electrostatic force calculated using a charge distribution. Alternatively, the distribution center position and the affected radius corresponding to the electrostatic force at a writing position in an xy-plane direction may be obtained in advance by performing a trajectory simulation on low-energy secondary electrons under the z-direction electric field distribution on the axis determined through designing the electrostatic lens, the z-direction magnetic field distribution on the axis determined through designing the objective lens, and an electrostatic force in the xy-plane direction, in which different directions and strengths from each other are hypothesized.

Figure 13A:
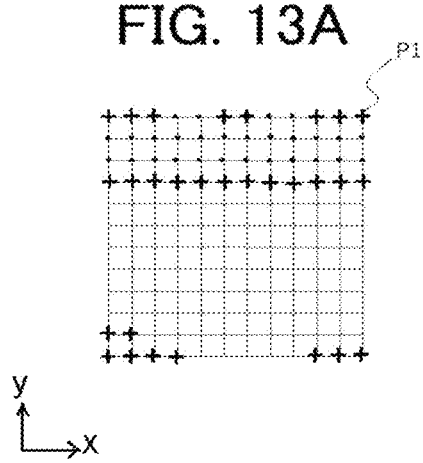
FIGS. 13A and 13B are diagrams illustrating an example of an evaluation pattern.
Figure 13B:
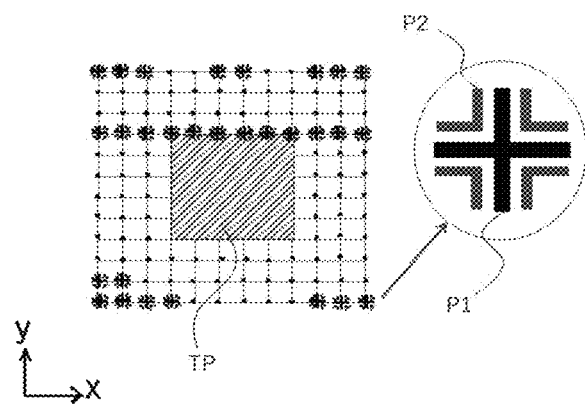

Position-shift correction effects caused by updating the distribution center position and affected radius of the distribution function corresponding to low-energy fogging electrons will be described using FIGS. 13 to 15. First, as illustrated in FIG. 13A, a cross reference pattern P1 is written on each grid point except for the center portion of an evaluation board. For the sake of brevity, some of the reference patterns P1 are not illustrated. Next, as illustrated in FIG. 13B, a test pattern TP having an area density of about 25% is written in the center portion of the evaluation board. Subsequently, an L-shaped evaluation pattern P2 is written near the reference pattern P1 on each grid point.

Figure 14A:
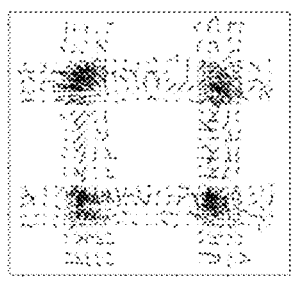
FIGS. 14A to 14C are diagrams illustrating an example of results of writing.
Figure 14B:
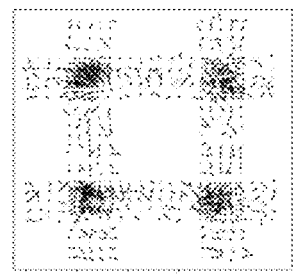
Figure 14C:
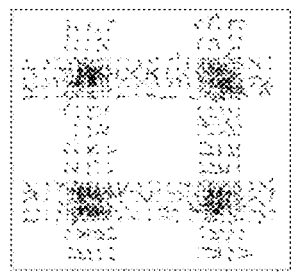

The position shift amount of the evaluation pattern P2 in a periphery grid portion of the region where the test pattern TP is written is then measured using the reference pattern P1 as a reference. FIG. 14A is a vector diagram of position shift amounts (a position error map) in a case where, similarly to as in the conventional charge correction method, the differences in the energy of fogging electrons are not considered and the irradiation position of the evaluation pattern P2 is corrected on the basis of a charge amount distribution including only one fogging charge term. FIG. 14B illustrates a position error map in a case where the irradiation position of the evaluation pattern P2 is corrected assuming that the distribution center position and affected radius of the distribution function corresponding to high-energy fogging electrons and those of the distribution function corresponding to low-energy fogging electrons are constant. FIG. 14C illustrates a position error map in a case where the irradiation position of the evaluation pattern P2 is corrected while the distribution center position and the affected radius of the distribution function corresponding to low-energy fogging electrons are being updated in accordance with a charge amount distribution. The scale of a vector length, which represents the absolute value of a position shift amount, is common for FIGS. 14A to 14C.

Figure 15A:
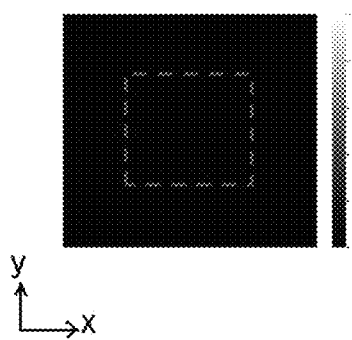
FIGS. 15A to 15C are diagrams illustrating low-energy fogging electron charge amount distributions.
Figure 15B:
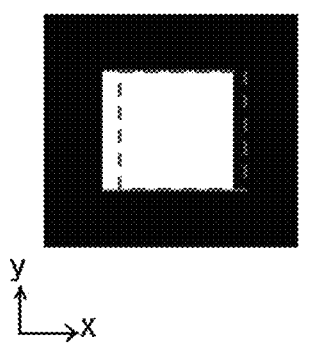
Figure 15C:
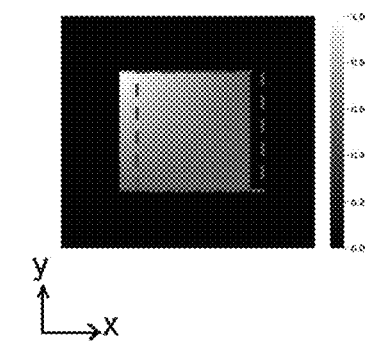

Low-energy fogging electron charge distributions calculated at the time of correction in FIGS. 14A to 14C are illustrated in FIGS. 15A to 15C. The regions surrounded by broken lines in the figures represent the test pattern TP in FIG. 12B. In FIG. 15A, similarly to as in the conventional charge correction method, the differences in the energy of fogging electrons are not considered, and assume that a low-energy fogging electron distribution is zero. In FIG. 15B, a charge distribution is calculated supposing that the distribution center position and the affected radius of the distribution function corresponding to low-energy fogging electrons are constant, and thus a constant low-energy fogging electron charge is calculated at a position shifted from the region of the test pattern TP. In FIG. 15C, a charge distribution is calculated while updating the distribution center position and the affected radius of the distribution function corresponding to low-energy fogging electrons in accordance with the charge amount distribution. In this case, as illustrated in FIG. 2, since writing is performed from the −Y direction to the +Y direction, for example, low-energy secondary electrons generated in the i-th frame region are deflected in the +Y direction by receiving electrostatic force in the +Y direction from the charge distribution of the −Y side region of the frames up to the (i−1)-th frame in which writing has been completed, and perform the E-cross-B drift in the −X direction due to the effect of the fringing magnetic field due to the objective lens and thereafter reach the substrate to act as low-energy fogging electrons. When these are taken into consideration, the low-energy fogging electron charge distribution shifts from the region of the test pattern TP as in FIG. 15B and is calculated as an unbalanced distribution in which the charge amount on the −X direction side and the charge amount on the +Y direction side are large unlike in FIG. 15B. In FIGS. 15A to 15C, the gray scale representing the charge amounts are displayed with arbitrary increments.

It is clear from FIGS. 14A to 14C that, as illustrated in FIG. 15B, the charge amounts are calculated by separately obtaining the charge amount distribution due to high-energy fogging electrons and the charge amount distribution due to low-energy fogging electrons, thereby reducing the correction residuals. Furthermore, as illustrated in FIG. 15C, it is clear that the correction residuals are further reduced by updating the distribution center position and the affected radius of the distribution function corresponding to low-energy fogging electrons in accordance with the charge amount distribution.

Irradiation position shifts due to charging phenomena do not happen only to electron beam writing apparatuses. The present invention can be applied to a charged particle beam apparatus that uses a result obtained by irradiating a target position with a charged particle beam, the charged particle beam apparatus being, for example, an inspection apparatus that inspects a pattern using a charged particle beam such as an electron beam.

The present invention is described above in detail with reference to particular aspects, but it should be clear to the skilled person in the art that various modifications are possible without departing from the intention and scope of the present invention.

The present application is based upon Japanese Patent Application No. 2018-211526, filed on Nov. 9, 2018, the entire contents of which are incorporated herein by reference.

REFERENCE SIGNS LIST 1 electron column
2 substrate
3 XY stage
4 mirror
5 electron gun
6 electron beam
7 illumination lens
8 first aperture
9 projection lens
10 deflector
11 second aperture
12 objective lens
13 deflector
14 writing chamber
15 electrostatic lens
21, 140 storage device
30 writing controller
31 pattern-density distribution calculator
32 dose distribution calculator
33 exposure-amount distribution calculator
34 fogging-electron-amount distribution calculator
35 charge-amount distribution calculator
36 writing elapsed-time calculator
37 cumulative time calculator
38 position-shift-amount distribution calculator
41 shot data generator
42 position shift corrector
43 shaping deflector controller
44 objective deflector controller
45 stage position detector
46 stage controller
100 writing apparatus
150 writing unit
160 control unit

The invention claimed is:

1. A charged particle beam writing apparatus that writes a pattern on a substrate on a stage by causing a deflector to deflect a charged particle beam, the charged particle beam writing apparatus comprising:
a pattern-density distribution calculator virtually dividing a writing region of the substrate in a mesh-like manner and calculating a pattern density distribution indicating an arrangement ratio of the pattern for each mesh region;
a dose distribution calculator calculating a dose distribution indicating a dose for each mesh region using the pattern density distribution;
an exposure-amount distribution calculator calculating an exposure amount distribution of the charged particle beam, which is emitted from an emitter and to which the substrate is exposed, using the pattern density distribution and the dose distribution;
a fogging charged particle amount distribution calculator calculating a plurality of fogging charged particle amount distributions by convoluting each of a plurality of distribution functions for fogging charged particles with the exposure amount distribution, the plurality of distribution functions having different distribution centers and radius of influence of a fogging effect from each other;
a charge-amount distribution calculator calculating a charge amount distribution due to direct charge using the pattern density distribution, the dose distribution, and the exposure amount distribution, and calculating a plurality of charge amount distributions due to fogging charge using the plurality of fogging charged particle amount distributions;
a position shift amount calculator calculating a position shift amount of a writing position based on the charge amount distribution due to direct charge and the plurality of charge amount distributions due to fogging charge;
a corrector correcting an exposure position using the position shift amount; and
a writer exposing the corrected exposure position to a charged particle beam.

2. The charged particle beam writing apparatus according to claim 1, wherein the charge-amount distribution calculator calculates the charge amount distribution due to direct charge and the plurality of charge amount distributions due to fogging charge using a charge decay amount and a charge decay time constant, the charge decay amount being a charge amount immediately after writing with reference to a charge amount obtained after a sufficient time has elapsed after writing.

3. The charged particle beam writing apparatus according to claim 1, wherein the plurality of distribution functions for fogging charged particles include a first distribution function and a second distribution function, a distribution center position of the first distribution function is a center of a distribution by design for a fogging charged particle, and a distribution center position of the second distribution function is shifted from the center of the distribution by design for the fogging charged particle.

4. The charged particle beam writing apparatus according to claim 3, wherein, for the second distribution function, the distribution center position and the radius affected by the fogging effect are updated on a basis of the charge amount distribution due to direct charge and the plurality of charge amount distributions due to fogging charge.

5. The charged particle beam writing apparatus according to claim 1, wherein an electrostatic lens to which a negative potential is applied is arranged above the substrate.

6. A charged particle beam writing method that writes a pattern on a substrate on a stage by causing a deflector to deflect a charged particle beam, the charged particle beam writing method comprising:
virtually dividing a writing region of the substrate in a mesh-like manner and calculating a pattern density distribution indicating an arrangement ratio of the pattern for each mesh region;
calculating a dose distribution indicating a dose for each mesh region using the pattern density distribution;
calculating an exposure amount distribution of the charged particle beam, to which the substrate is exposed, using the pattern density distribution and the dose distribution;
calculating a plurality of fogging charged particle amount distributions by convoluting each of a plurality of distribution functions for fogging charged particles with the exposure amount distribution, the plurality of distribution functions having different distribution centers and radius of influence of a fogging effect from each other;

calculating a charge amount distribution due to direct charge using the pattern density distribution, the dose distribution, and the exposure amount distribution, and calculating a plurality of charge amount distributions due to fogging charge using the plurality of fogging charged particle amount distributions;

calculating a position shift amount of a writing position based on the charge amount distribution due to direct charge and the plurality of charge amount distributions due to fogging charge;

correcting an exposure position using the position shift amount; and exposing the corrected exposure position to a charged particle beam.

7. The charged particle beam writing method according to claim 6, wherein, for calculation of the charge amount distribution due to direct charge and the plurality of charge amount distributions due to fogging charge, a charge decay amount and a charge decay time constant are used, the charge decay amount being a charge amount immediately after writing with reference to a charge amount obtained after a sufficient time has elapsed after writing.

8. The charged particle beam writing method according to claim 6, wherein the plurality of distribution functions for fogging charged particles include a first distribution function and a second distribution function, a distribution center position of the first distribution function is a center of a distribution by design for a fogging charged particle, and a distribution center position of the second distribution function is shifted from the center of the distribution by design for the fogging charged particle.

9. The charged particle beam writing method according to claim 8, wherein the distribution center position and the radius affected by the fogging effect of the second distribution function are updated on a basis of the charge amount distribution due to direct charge and the plurality of charge amount distributions due to fogging charge.

10. The charged particle beam writing method according to claim 6, wherein a negative potential is applied to an electrostatic lens arranged above the substrate.

11. A non-transitory computer-readable storage medium with an executable program stored thereon, wherein the program causes a computer to execute:

processing in which a writing region of a substrate on which a pattern is to be written by causing a deflector to deflect a charged particle beam is virtually divided in a mesh-like manner and a pattern density distribution indicating an arrangement ratio of the pattern is calculated for each mesh region;

processing in which a dose distribution indicating a dose for each mesh region is calculated using the pattern density distribution;

processing in which an exposure amount distribution of the charged particle beam, to which the substrate is exposed, is calculated using the pattern density distribution and the dose distribution;

processing in which a plurality of fogging charged particle amount distributions are calculated by convoluting each of a plurality of distribution functions for fogging charged particles with the exposure amount distribution, the plurality of distribution functions having different distribution centers and radius of influence of a fogging effect from each other;

processing in which a charge amount distribution due to direct charge is calculated using the pattern density distribution, the dose distribution, and the exposure amount distribution, and a plurality of charge amount distributions due to fogging charge are calculated using the plurality of fogging charged particle amount distributions;

processing in which a position shift amount of a writing position is calculated that is based on the charge amount distribution due to direct charge and the plurality of charge amount distributions due to fogging charge;

processing in which an exposure position is corrected using the position shift amount; and processing in which the corrected exposure position is exposed to a charged particle beam.

12. The non-transitory computer-readable storage medium according to claim 11, wherein, for calculation of the charge amount distribution due to direct charge and the plurality of charge amount distributions due to fogging charge, a charge decay amount and a charge decay time constant are used, the charge decay amount being a charge amount immediately after writing with reference to a charge amount obtained after a sufficient time has elapsed after writing.

13. The non-transitory computer-readable storage medium according to claim 11, wherein the plurality of distribution functions for fogging charged particles include a first distribution function and a second distribution function, a distribution center position of the first distribution function is a center of a distribution by design for a fogging charged particle, and a distribution center position of the second distribution function is shifted from the center of the distribution by design for the fogging charged particle.

14. The non-transitory computer-readable storage medium according to claim 13, wherein the distribution center position and the radius affected by the fogging effect of the second distribution function are updated on a basis of the charge amount distribution due to direct charge and the plurality of charge amount distributions due to fogging charge.

* * * * *